(12) United States Patent
Funch et al.

(10) Patent No.: US 9,349,880 B2
(45) Date of Patent: May 24, 2016

(54) SEMICONDUCTOR DEVICES WITH SEMICONDUCTOR BODIES HAVING INTERLEAVED HORIZONTAL PORTIONS AND METHOD OF FORMING THE DEVICES

(71) Applicant: International Business Machines Corporation, Armonk, NY (US)

(72) Inventors: Christopher J. Funch, Winooski, VT (US); Qizhi Liu, Lexington, MA (US); Dean W. Siegel, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/306,373

(22) Filed: Jun. 17, 2014

(65) Prior Publication Data

US 2015/0364611 A1  Dec. 17, 2015

(51) Int. Cl.
*H01L 29/868* (2006.01)
*H01L 29/66* (2006.01)
*H01L 49/02* (2006.01)

(52) U.S. Cl.
CPC .............. *H01L 29/868* (2013.01); *H01L 28/86* (2013.01); *H01L 28/90* (2013.01); *H01L 29/6609* (2013.01)

(58) Field of Classification Search
CPC .................. H01L 27/14647; H01L 27/14652; H01L 28/86–28/88; H01L 29/6609; H01L 29/66121; H01L 29/8613; H01L 29/868; H01L 31/047; H01L 31/0687; H01L 31/075; H01L 31/076; H01L 31/105
See application file for complete search history.

(56) References Cited

U.S. PATENT DOCUMENTS

| | | | | |
|---|---|---|---|---|
| 3,994,012 A * | 11/1976 | Warner, Jr. | | 136/246 |
| 4,899,204 A | 2/1990 | Rosen et al. | | |
| 5,155,657 A * | 10/1992 | Oehrlein | | H01L 21/3065 257/298 |
| 5,160,987 A * | 11/1992 | Pricer | | H01L 21/30608 257/303 |
| 5,797,998 A * | 8/1998 | Wenham | | H01L 31/022425 136/255 |
| 5,990,415 A * | 11/1999 | Green | | H01L 27/142 136/255 |
| 6,127,220 A * | 10/2000 | Lange et al. | | 438/254 |
| 6,204,119 B1 * | 3/2001 | Lange | | H01L 28/87 257/E21.016 |
| 6,900,109 B2 | 5/2005 | Onishi et al. | | |
| 7,224,015 B1 * | 5/2007 | Skotnicki | | H01L 27/10817 257/306 |

(Continued)

FOREIGN PATENT DOCUMENTS

EP  2400529 A3  4/2013

*Primary Examiner* — Bryan Junge
(74) *Attorney, Agent, or Firm* — Gibb & Riley, LLC; Anthony J. Canale

(57) ABSTRACT

Disclosed are semiconductor devices (e.g., diodes, such as PN junction diodes and PIN junction diodes, and capacitors) that have semiconductor bodies with interleaved horizontal portions. In the case of a diode, the semiconductor bodies can have different type conductivities and, optionally, can be separated by an intrinsic semiconductor layer. In the case of a capacitor, the semiconductor bodies can have the same or different type conductivities and can be separated by a dielectric layer. In any case, due to the interleaved horizontal portions, the semiconductor devices each have a relatively large active device region within a relatively small area on an integrated circuit chip. Also disclosed herein are methods of forming such semiconductor devices.

17 Claims, 17 Drawing Sheets

(56) References Cited

U.S. PATENT DOCUMENTS

| | | |
|---|---|---|
| 7,682,920 B2 | 3/2010 | Herner |
| 7,932,536 B2 | 4/2011 | Hamerski et al. |
| 8,580,591 B2 | 11/2013 | Peroni et al. |
| 8,623,722 B2 | 1/2014 | Mouli |
| 8,637,386 B2 | 1/2014 | Zhang et al. |
| 2007/0012983 A1 | 1/2007 | Yang et al. |
| 2008/0197340 A1* | 8/2008 | Mears et al. .......... 257/21 |
| 2011/0065243 A1 | 3/2011 | Maxwell et al. |
| 2013/0313651 A1 | 11/2013 | Cheng et al. |

* cited by examiner

US 9,349,880 B2

SEMICONDUCTOR DEVICES WITH SEMICONDUCTOR BODIES HAVING INTERLEAVED HORIZONTAL PORTIONS AND METHOD OF FORMING THE DEVICES

BACKGROUND

The present invention relates to semiconductor devices, such as diodes and capacitors, and methods of forming the semiconductor devices so as to have semiconductor bodies with interleaved horizontal portions and, thereby relatively large active device regions.

More specifically, integrated circuit chip design decisions are often driven by semiconductor device scalability. For example, while it may be desirable to reduce the size of photo diodes in order to increase the device density of photo diodes in a diode array on an integrated circuit chip and, thereby to reduce the area of the chip consumed by that diode array, reducing the overall size of a photo diode typically reduces the size of the active device region and results in a corresponding reduction in photon detection sensitivity. Similarly, while it may be desirable to reduce the size of capacitor on an integrated circuit chip in order to reduce the area of the chip consumed by that capacitor, reducing the overall size of a capacitor typically reduces the size of the active device region and results in a corresponding reduction in capacitance. Therefore, there is a need in the art for a semiconductor device and a method of forming the semiconductor device so as to consume a relatively small area of an integrated circuit chip and still provide a relatively large active device region.

SUMMARY

In view of the disclosed herein are semiconductor devices (e.g., diodes, such as PN junction diodes and PIN junction diodes, and capacitors) that have semiconductor bodies with interleaved horizontal portions. In the case of a diode, the semiconductor bodies can have different type conductivities and, optionally, can be separated by an intrinsic semiconductor layer. In the case of a capacitor, the semiconductor bodies can have the same or different type conductivities and can be separated by a dielectric layer. In any case, due to the interleaved horizontal portions, the semiconductor devices each have a relatively large active device region within a relatively small area on an integrated circuit chip. Also disclosed herein are methods of forming such semiconductor devices.

More particularly, disclosed herein are semiconductor devices (e.g., diodes, such as PN junction diodes and PIN junction diodes, and capacitors). Each semiconductor device can comprise two discrete semiconductor bodies with interleaved horizontal portions, which ensure that the semiconductor device has a relatively large active device region within a relatively small area on an integrated circuit chip. Specifically, each semiconductor device can comprise a first semiconductor body and a second semiconductor body adjacent to the first semiconductor body. The first semiconductor body can have a first vertical portion and multiple first horizontal portions in contact with and extending laterally from the first vertical portion. The second semiconductor body can have a second vertical portion and multiple second horizontal portions in contact with and extending laterally from the second vertical portion such that they are interleaved with the first horizontal portions. In the case of a diode (e.g., a PN junction diode or a PIN junction diode), the first semiconductor body can have a first type conductivity and the second semiconductor body can have a second type conductivity different from the first type conductivity. In the case specifically of a PIN junction diode, the first semiconductor body can further be separated from the second semiconductor body by a conformal intrinsic semiconductor layer. In the case of a capacitor, the first semiconductor body and the second semiconductor body can have either the same type conductivity or different type conductivities and can be separated by a conformal dielectric layer.

Also disclosed herein are methods of forming a semiconductor device (e.g., a diode, such as a PN junction diode or a PIN junction diode, or a capacitor), as described above, so as to have two discrete semiconductor bodies with interleaved horizontal portions, which ensure that the semiconductor device has a relatively large active device region within a relatively small area on an integrated circuit chip. Generally, the methods can comprise forming a first semiconductor body having a first vertical portion and multiple first horizontal portions in contact with and extending laterally from the first vertical portion. The methods can further comprise forming a second semiconductor body adjacent to the first semiconductor body. This second semiconductor body can have a second vertical portion and multiple second horizontal portions in contact with and extending laterally from the second vertical portion such that they are interleaved with the first horizontal portions.

One particular method of forming a semiconductor device (e.g., a diode, such as a PN junction diode or a PIN junction diode, or capacitor), as described above, can specifically comprise forming a first semiconductor body having a first vertical portion and multiple first horizontal portions in contact with and extending laterally from the first vertical portion. This first semiconductor body can be formed, for example, by forming multiple semiconductor layers in a stack. The multiple semiconductor layers can be formed such that they comprise alternating first semiconductor layers and second semiconductor layers. The first semiconductor layers can be different from the second semiconductor layers such that the second semiconductor layers can be selectively etched over the first semiconductor layers during subsequent processing. For example, the first semiconductor layers and the second semiconductor layers can comprise the same semiconductor material (e.g., silicon). However, the first semiconductor layers can be doped so as to have a first type conductivity and the second semiconductor layers can be either undoped (i.e., intrinsic) or doped so as to have a second type conductivity different from the first type conductivity. Thus, the second semiconductor layers can be selectively etched over the first semiconductor layers during subsequent processing. In another example, the first semiconductor layers and second semiconductor layers can be doped so as to have the same type conductivity (e.g., the first type conductivity), but can comprise different semiconductor materials (e.g., silicon germanium and silicon, respectively) such that the second semiconductor layers can be selectively etched over the first semiconductor layers during subsequent processing. A dopant implant region can then be formed in the stack of semiconductor layers. The specific dopant used to form the dopant implant region can be preselected so that the portions of the second semiconductor layers contained within the dopant implant region will etch, during the subsequent processing, at approximately the same rate as the first semiconductor layers and at a significantly slower than other portions of the second semiconductor layers outside the dopant implant region. Additionally, a trench can be formed around and physically separated from the dopant implant region. This trench can further be formed such that it extends vertically from the top surface of the stack to at least a lowest second semiconductor layer in the stack. Next, exposed surfaces of the second semiconductor layers within the trench can be selectively etched over the first semiconductor layers and the dopant implant region, thereby forming the first semiconductor body having the first type conductivity and comprising a first vertical portion, which corresponds to the dopant implant region, and multiple first horizontal portions in contact with and extending laterally from the first vertical portion.

After the first semiconductor body is formed, the method can comprise forming a second semiconductor body adjacent to the first semiconductor body. The second semiconductor body can be formed by epitaxially depositing an additional semiconductor layer into the trench. As a result of the shape of the trench following the selective etch process, the resulting second semiconductor body will comprise a second vertical portion and multiple second horizontal portions, which are in contact with and extend laterally from the second vertical portion and which are interleaved with the first horizontal portions.

When a diode (e.g., a PN junction diode or a PIN junction diode) is being formed, the additional semiconductor layer can be in situ doped during the epitaxial deposition process so that the second semiconductor body has a second type conductivity that is different from the first type conductivity of the first semiconductor body. When a PIN junction diode in particular is being formed, the method can further comprise, after the selective etch process is performed and before the additional semiconductor layer is epitaxially deposited, epitaxially depositing a conformal intrinsic semiconductor layer in the trench on the first semiconductor body. When a capacitor is being formed, the additional semiconductor layer can be in situ doped during the epitaxial deposition process so that the second semiconductor body has either the same type conductivity as the first semiconductor body (e.g., the first type conductivity) or a different type conductivity than the first semiconductor body (e.g., the second type conductivity). Additionally, when a capacitor is being formed, the method can further comprise, after the selective etch process is performed and before the second semiconductor body is formed, forming a conformal dielectric layer in the trench on the first semiconductor body.

BRIEF DESCRIPTION OF THE SEVERAL VIEWS OF THE DRAWINGS

The embodiments herein will be better understood from the following detailed description with reference to the drawings, which are not necessarily drawn to scale and in which.

DETAILED DESCRIPTION

As mentioned above, integrated circuit chip design decisions are often driven by semiconductor device scalability. For example, while it may be desirable to reduce the size of photo diodes in order to increase the device density of photo diodes in a diode array on an integrated circuit chip and, thereby to reduce the area of the chip consumed by that diode array, reducing the overall size of a photo diode typically reduces the size of the active device region and results in a corresponding reduction in photon detection sensitivity. Similarly, while it may be desirable to reduce the size of capacitor on an integrated circuit chip in order to reduce the area of the chip consumed by that capacitor, reducing the overall size of a capacitor typically reduces the size of the active device region and results in a corresponding reduction in capacitance. Therefore, there is a need in the art for a semiconductor device and a method of forming the semiconductor device so as to consume a relatively small area of an integrated circuit chip and still provide a relatively large active device region.

In view of the disclosed herein are semiconductor devices (e.g., diodes, such as PN junction diodes and PIN junction diodes, and capacitors) that have semiconductor bodies with interleaved horizontal portions. In the case of a diode, the semiconductor bodies can have different type conductivities and, optionally, can be separated by an intrinsic semiconductor layer. In the case of a capacitor, the semiconductor bodies can have the same or different type conductivities and can be separated by a dielectric layer. In any case, due to the interleaved horizontal portions, the semiconductor devices each have a relatively large active device region within a relatively small area on an integrated circuit chip. Also disclosed herein are methods of forming such semiconductor devices.

Figure 1:
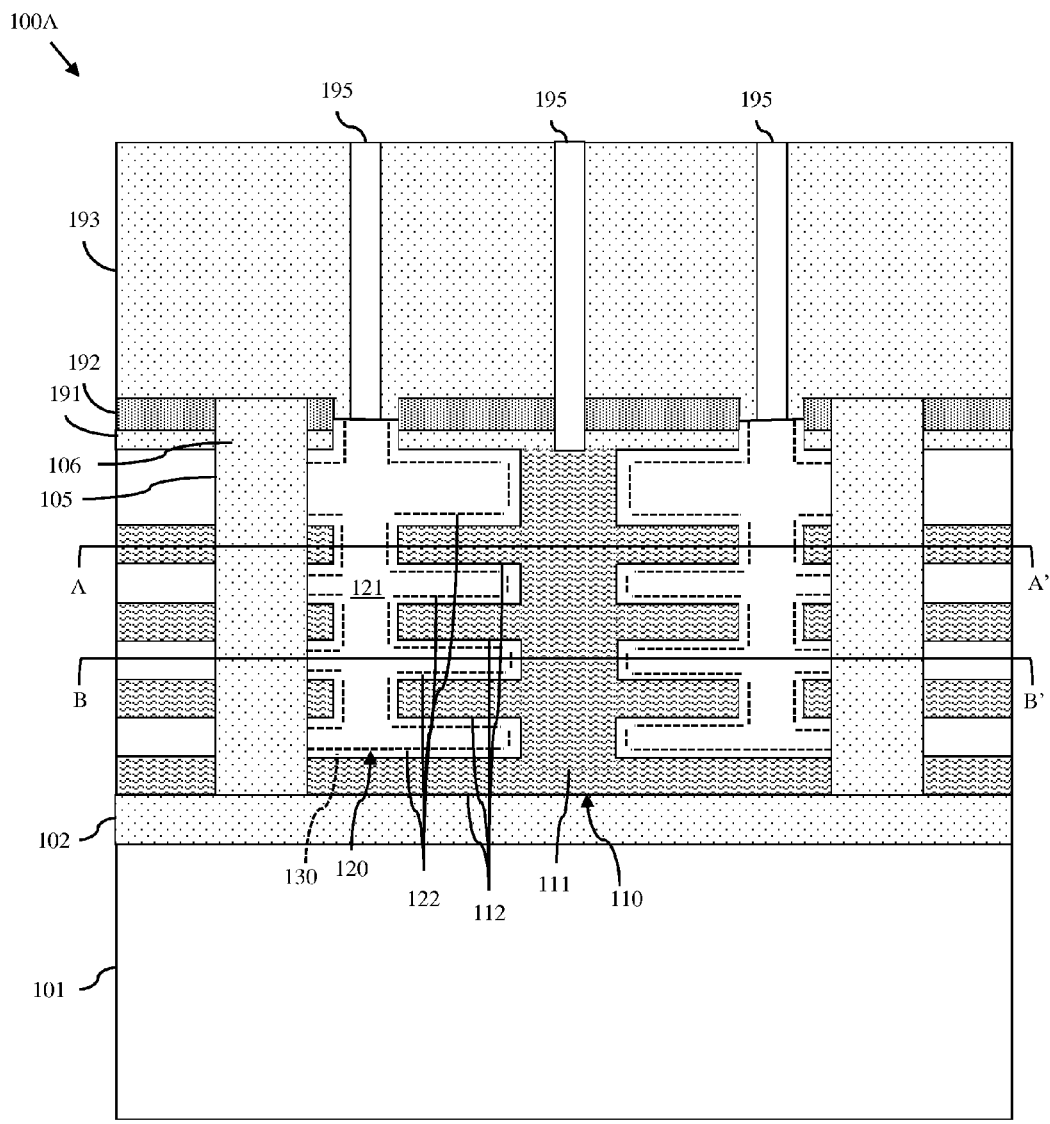
FIG. 1 is a cross-section illustration of a semiconductor device formed on a semiconductor-on-insulator (SOI) wafer through a vertical plane that cuts across the length of the device.
Figure 2:
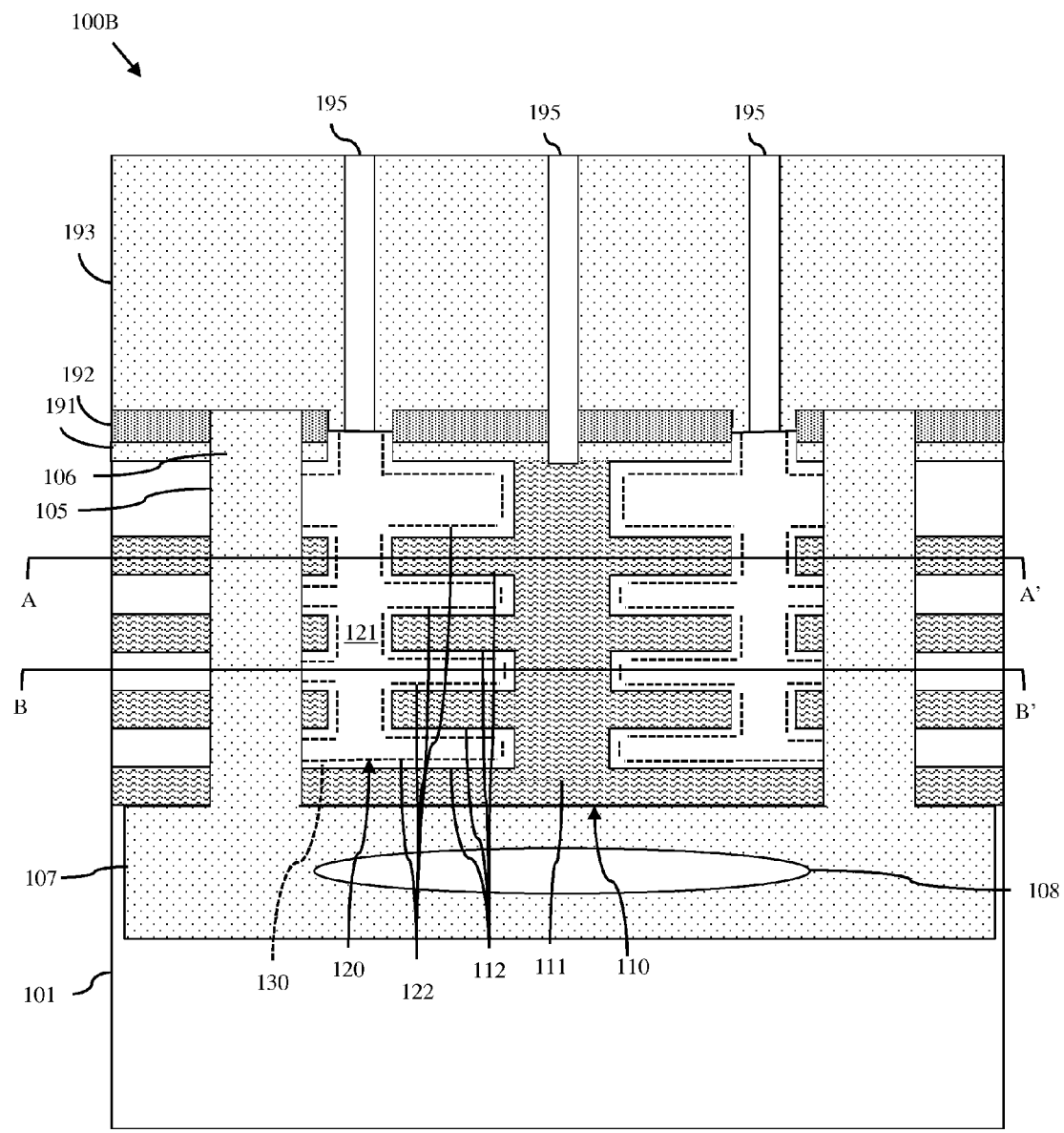
FIG. 2 is a cross-section illustration of another semiconductor device formed on a bulk semiconductor wafer through a vertical plane that cuts across the length of the device.

For example, FIGS. 1 and 2 illustrate semiconductor devices 100A and 100B, respectively. Each of these semiconductor devices 100A, 100B (e.g., a diode, such as a PN junction diode or a PIN junction diode, or a capacitor) comprising two discrete semiconductor bodies 110, 120 with interleaved horizontal portions. The interleaved horizontal portions ensure that the semiconductor devices 100A, 100B have a relatively large active device region within a relatively small area on an integrated circuit chip. More specifically, the semiconductor devices disclosed herein can be formed on either a semiconductor-on-insulator (SOI) wafer or on a bulk semiconductor wafer. For example, FIG. 1 specifically illustrates a semiconductor device 100A formed on an SOI wafer. That is, the semiconductor device 100A can comprise a semiconductor substrate 101 (e.g., a silicon substrate or any other suitable semiconductor substrate) and an insulator layer 102 (e.g., a silicon dioxide layer, a silicon nitride layer, a silicon oxynitride layer, or any other suitable insulator layer) on the semiconductor substrate 101. In this case, the two discrete semiconductor bodies 110, 120 can be above the insulator layer 102. FIG. 2 specifically illustrates a semiconductor device 100B formed on a bulk semiconductor wafer. That is, the semiconductor device 100B can comprise a semiconductor substrate 101 (e.g., a silicon substrate or any other suitable semiconductor substrate) and a buried isolation region 107 in the semiconductor substrate 101. The buried isolation region 107 can, for example, comprise a cavity, which is within semiconductor substrate 101 and which is filled with one or more isolation materials 106 (e.g., silicon dioxide, silicon nitride, silicon oxynitride, and/or any other suitable isolation material(s)). Optionally, there may be one or more airgaps 108 (i.e., voids) within the isolation material(s) 106 filling the cavity of the buried isolation region 107. In this case, the two discrete semiconductor bodies 110, 120 can be aligned above the buried isolation region 107.

Referring to FIGS. 1 and 2 in combination, each of the semiconductor devices 100A, 100B can comprise a first semiconductor body 110 and a second semiconductor body 120 positioned laterally adjacent to and wrapping around the first semiconductor body 110. The first semiconductor body 110 and the second semiconductor body 120 can each comprise a silicon-based semiconductor material (e.g., silicon, silicon germanium, polysilicon, polysilicon germanium, carbon-doped silicon, carbon-doped polysilicon, etc.) or any other suitable semiconductor material (e.g., a gallium nitride (GaN) or gallium arsenide (GaAs)-based semiconductor material). The semiconductor material of the first semiconductor body 110 and the second semiconductor body 120 may be the same (except for dopants used to establish different type conductivities, if necessary, as discussed in greater detail below) or different.

Figure 3:
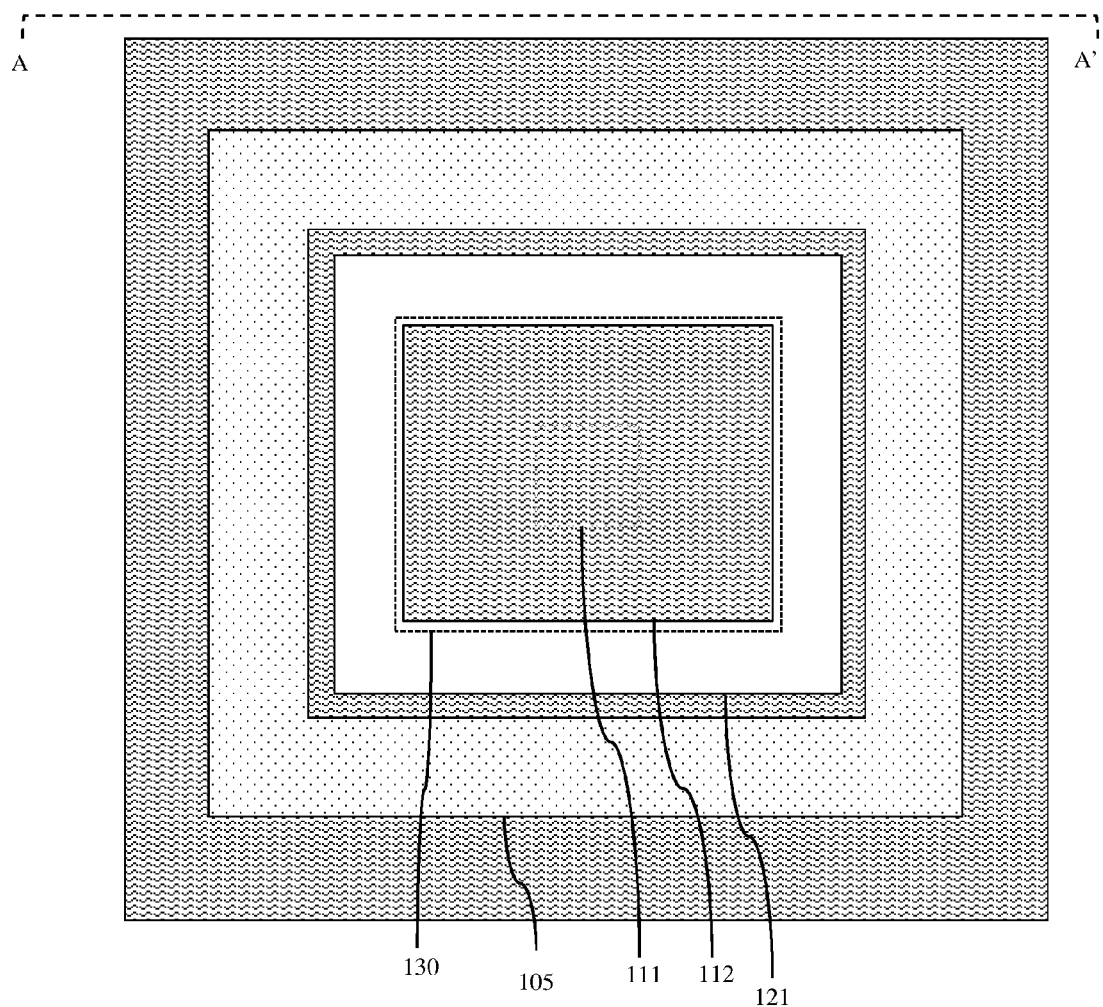
FIG. 3 is a cross-section illustration of either of the semiconductor devices of FIGS. 1 and 2 through a horizontal plane that cuts across the length of the device (e.g., see horizontal plane A-A' indicated in FIGS. 1 and 2)
Figure 4:
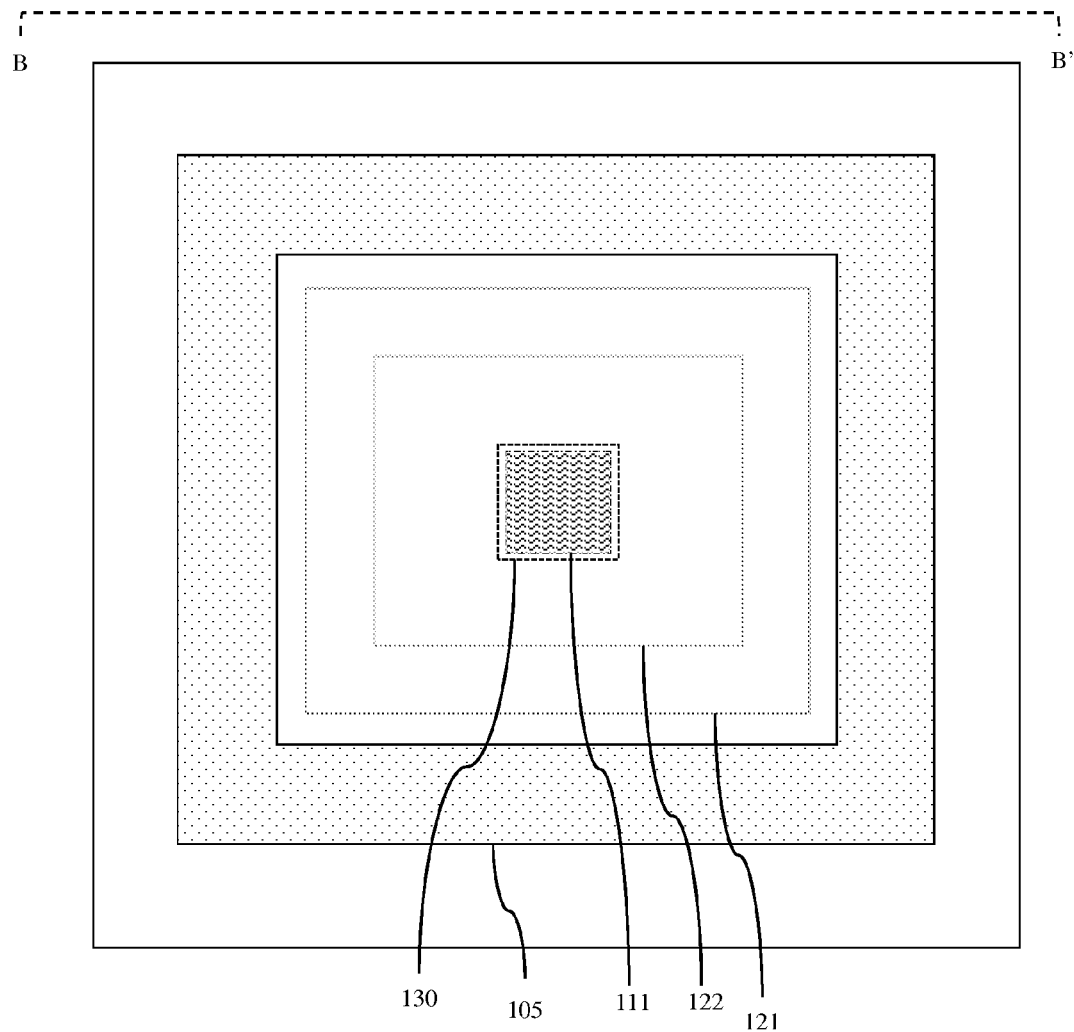
FIG. 4 is another cross-section illustration of either of the semiconductor devices of FIGS. 1 and 2 through another horizontal plane that cuts across the length of the device (e.g., see horizontal plane B-B' indicated in FIGS. 1 and 2)

Referring to FIGS. 1 and 2 in combination with the cross-section diagrams of FIGS. 3 and 4, the first semiconductor body 110 can have a first vertical portion 111 and multiple first horizontal portions 112 in contact with and extending laterally from the first vertical portion 111.

The second semiconductor body 120 can have a second vertical portion 121 and multiple second horizontal portions 122 in contact with and extending laterally from the second vertical portion 121 such that they are interleaved with the multiple first horizontal portions 112.

Specifically, in the semiconductor devices 100A, 100B, the first vertical portion 111 can correspond to a dopant implant region formed during processing (as discussed in greater detail below with regard to the methods). The first horizontal portions 112 of the second semiconductor body 120 can extend outward from that first vertical portion 111, can be positioned one above the other, and can be physically separated by some distance. The second vertical portion 121 of the second semiconductor body 120 can be a continuous structure that is positioned laterally adjacent to and wraps around the first semiconductor body 110. The second horizontal portions 122 of the second semiconductor body 120 can extend outward from the second vertical portion 121 towards the first vertical portion 111 of the first semiconductor body 110, can be positioned one above the other, and can be separated by some distance. The first horizontal portions 112 and the second horizontal portions 122 can be vertically offset and interleaved (i.e., interdigitated, interlocked, etc. as in a box joint or finger joint) such that each pair of adjacent first horizontal portions of the first semiconductor body 110 is separated by a second horizontal portion of the second semiconductor body 120 and vice versa. The sizes of the spaces between adjacent first horizontal portions 112 and between adjacent second horizontal portions 122 can be essentially uniform, as illustrated. Alternatively, the sizes of such spaces can be varied as long as there are corresponding variations the sizes (e.g., thicknesses) of the horizontal portions that fill those spaces in order to achieve the above-described interleaving. Additionally, it should be noted that, for purposes of illustration, four first horizontal portions 112 and four second horizontal portions 122 are shown in FIGS. 1 and 2. However, it should be understood the semiconductor devices 100A, 100B can comprise any number of two or more first horizontal portions and any number of two or more second horizontal portions as long as the numbers correspond in order to achieve the above-described interleaving.

As mentioned above, the semiconductor devices 100A, 100B can comprise diodes (e.g., PN junction diodes or PIN junction diodes) or capacitors. In the case of a diode (e.g., a PN junction diode or a PIN junction diode), the first semiconductor body 110 can have a first type conductivity (e.g., P-type conductivity) and the second semiconductor body 120 can have a second type conductivity (e.g., N-type conductivity), which is different from the first type conductivity. In the case of a capacitor, the first semiconductor body 110 and the second semiconductor body 120 can have the same type conductivity (e.g., both P-type conductivity or both N-type conductivity). Alternatively, in the case of a capacitor, the first semiconductor body 110 and the second semiconductor body 120 can different type conductivities (e.g., the first semiconductor body 110 can have P-type conductivity and the second semiconductor body 120 can have N-type conductivity).

Those skilled in the art will recognize that different dopants can be used to achieve the desired type conductivities referenced above and that the dopants may vary depending upon the different semiconductor materials used. For example, a silicon-based semiconductor material having P-type conductivity can be doped with a P-type dopant (e.g., a Group III dopant, such as boron (B) or indium (In)), whereas a silicon-based semiconductor material having N-type conductivity is can be doped with a N-type dopant (e.g., a Group V dopant, such as arsenic (As), phosphorous (P) or antimony (Sb)). Alternatively, a gallium nitride (GaN) or gallium arsenide (GaAs)-based semiconductor material having P-type conductivity can be doped with beryllium (Be) or magnesium (Mg), whereas a gallium nitride (GaN) or gallium arsenide (GaAs)-based semiconductor material having N-type conductivity can be doped with silicon (Si). Therefore, in semiconductor devices 100A, 100B, the first semiconductor body 110 could, for example, comprise a P-type semiconductor body comprising boron-doped silicon and the second semiconductor body 120 could, for example, comprise an N-type semiconductor body comprising phosphorous-doped silicon (e.g., in the case of a diode or a capacitor) or another P-type semiconductor body comprising boron-doped silicon (e.g., in the case of a capacitor).

It should be noted that in the case of a PN junction diode, the second semiconductor body 120 will abut (i.e., will be immediately adjacent to) the first semiconductor body 110. Specifically, the horizontal surfaces and end surface of the first horizontal portions 112 of the first semiconductor body 110 will abut adjacent surfaces of the second semiconductor body 120 and the horizontal surfaces and end surface of the second horizontal portions 122 of the second semiconductor body 120 will abut adjacent surfaces of the first semiconductor body 110, thereby creating the P-type semiconductor material-N-type semiconductor material (PN) junction. However, alternatively, the semiconductor devices 100A, 100B can further comprise an optional conformal layer 130 so as to be PIN junction diode or a capacitor. This conformal layer 130 can line the horizontal and end surfaces of the first horizontal portions 112 of the first semiconductor body 110 as well as the vertical surfaces of the first vertical portion 111 adjacent to and between the first horizontal portions 112. Thus, the conformal layer 130 can physically separate the first semiconductor body 110 from the second semiconductor body 120. In this case of a PIN junction diode, this conformal layer 130 can comprise a conformal intrinsic semiconductor layer, thereby creating the P-type semiconductor material-Intrinsic semiconductor material-N-type semiconductor material (PIN) junction. For purposes of this disclosure, "an intrinsic semiconductor layer" refers to a semiconductor layer that is not doped with a dopant that alters conductivity (i.e., not doped with a P-type dopant or an N-type dopant). Thus, an intrinsic semiconductor layer is neither a P-type semiconductor layer, nor an N-type semiconductor layer. In the case of a capacitor, this conformal layer 130 can comprise a conformal dielectric layer (e.g., an oxide layer, a nitride layer, an oxynitride layer, or any other suitable dielectric layer), thereby creating the conductor-dielectric-conductor junction.

The semiconductor devices 100A, 100B can further comprise a trench isolation region 105 positioned laterally adjacent to and wrapping around an outer sidewall of the second vertical portion 121 so as to laterally surround the first semiconductor body 110 and second semiconductor body 120. The trench isolation region can further extend vertically to the insulator layer 102 (see FIG. 1) or to the buried isolation region 107 (see FIG. 2), as applicable. This trench isolation region 105 can comprise a trench filled with one or more isolation materials 106 (e.g., silicon dioxide, a silicon nitride, a silicon oxynitride, or any other suitable isolation material(s)). This trench isolation region 105 in combination with the insulator layer 102 or buried isolation region 107, as applicable, can electrically isolate the semiconductor device 100A or 100B, respectively, from the semiconductor substrate 101 and from any other devices formed on the semiconductor substrate 101.

The semiconductor devices 100A, 100B can further comprise one or more dielectric layers 191-193 stacked above the first semiconductor body 110 and second semiconductor body 120. These dielectric layers 191-192 can comprise, for example, a silicon dioxide layer 191, a silicon nitride layer 192 on the silicon dioxide layer 191 and one or more additional dielectric layers 193 (e.g., interlayer dielectrics) on the silicon nitride layer 192. The additional dielectric layer(s) can comprise, for example, one or more layers of any of the following dielectric materials: silicon dioxide, silicon nitride, silicon oxynitride, borophosphosilicate glass (BPSG), etc. The semiconductor devices 100A, 100B can further comprise contacts 195 extending vertically through the dielectric layers 191-193 to the first semiconductor body 110 and the second semiconductor body 120.

Also disclosed herein are methods of forming a semiconductor device (e.g., a diode or a capacitor), such as the semiconductor device 100A of FIG. 1 or 100B of FIG. 2, so as to have two discrete semiconductor bodies with interleaved horizontal portions, which ensure that the semiconductor device has a relatively large active device region within a relatively small area on an integrated circuit chip.

Figure 5:
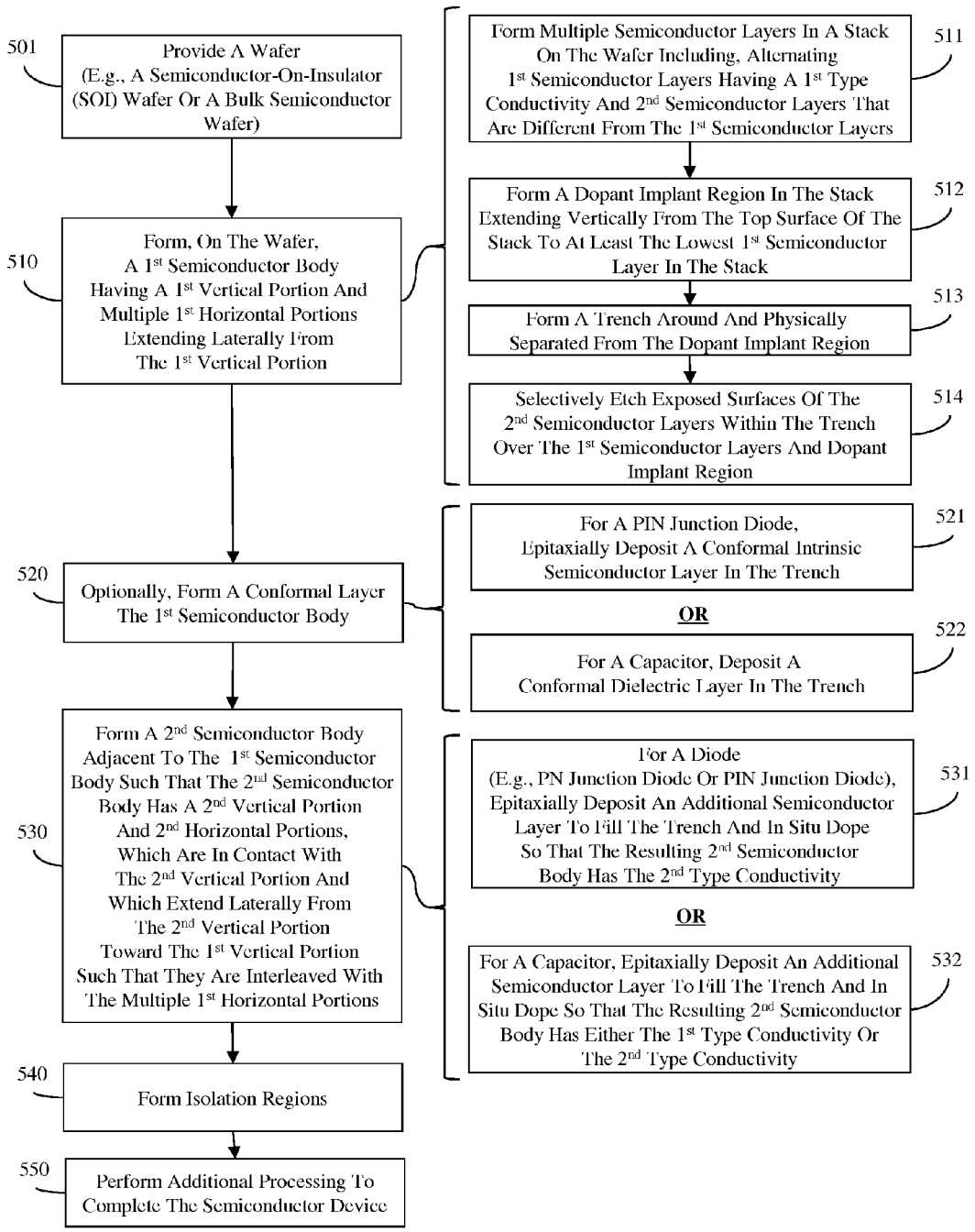
FIG. 5 is a flow diagram illustrating a method of forming the semiconductor devices 100A and 100B of FIGS. 1 and 2, respectively.
Figure 6A:
FIG. 6A is a partially completed semiconductor device formed on a semiconductor-on-insulator (SOI) wafer according to the method of FIG. 5.
Figure 6B:
FIG. 6B is a partially completed semiconductor device formed on a bulk semiconductor wafer according to the method of FIG. 5.

Referring to the flow diagram of FIG. 5, the methods can comprise providing a semiconductor wafer (501). This wafer can comprise, for example, a semiconductor-on-insulator (SOI) wafer comprising a semiconductor substrate 101 (e.g., a silicon substrate or any other suitable semiconductor substrate), an insulator layer 102 (e.g., a silicon dioxide layer, a silicon nitride layer, a silicon oxynitride layer, or any other suitable insulator layer) on the semiconductor substrate 101, and a semiconductor layer (e.g., a silicon-based semiconductor layer or any other suitable semiconductor layer) on the insulator layer (see FIG. 6A). Alternatively, this wafer can comprise a bulk semiconductor wafer comprising a semiconductor substrate 101 (e.g., a silicon substrate or any other suitable bulk semiconductor substrate) (see FIG. 6B). For purposes of illustration, the methods will generally be illustrated in the drawings to show formation of a semiconductor device using a bulk semiconductor wafer, as shown in FIG. 6B. However, it should be understood that essentially the same process steps could be used for formation of a semiconductor device using an SOI wafer, as shown in FIG. 6A, unless otherwise specified in this disclosure.

The method can further comprise forming, above the semiconductor substrate 101, a first semiconductor body 110 having a first vertical portion 111 and multiple first horizontal portions 112 in contact with and extending laterally from the first vertical portion 111 (510).

Figure 7:
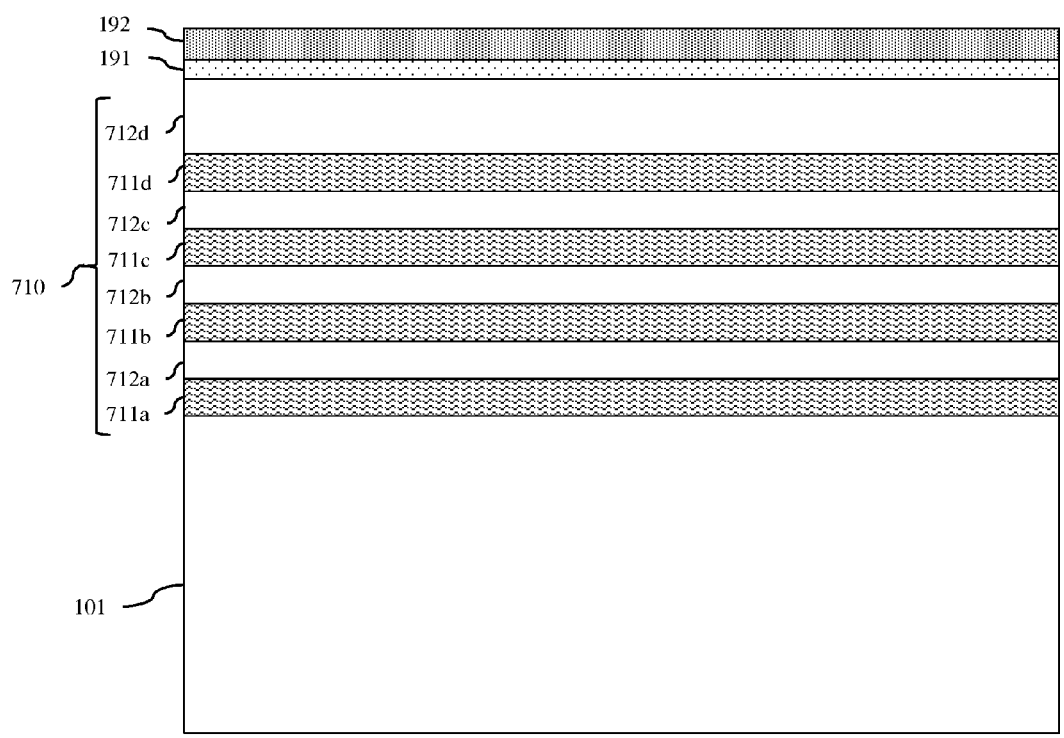
FIG. 7 is a partially completed semiconductor device formed according to the method of FIG. 5.

One exemplary technique for forming the first semiconductor body at process 502 can comprise forming multiple semiconductor layers in a stack 710 above the semiconductor substrate 101 (511, see FIG. 7). The multiple semiconductor layers can be formed by epitaxial deposition or any other suitable deposition technique such that they comprise alternating first semiconductor layers 711*a*-*d* and second semiconductor layers 712*a*-*d*. The semiconductor materials used for the multiple semiconductor layers can comprise silicon-based semiconductor materials (e.g., silicon, silicon germanium, polysilicon, polysilicon germanium, carbon-doped silicon, carbon-doped polysilicon, etc.) or any other suitable semiconductor materials (e.g., gallium nitride (GaN) or gallium arsenide (GaAs)-based semiconductor materials). Those skilled in the art will recognize that different dopants can be used to achieve any desired type conductivities, as discussed in greater detail below, and that the dopants may vary depending upon the different semiconductor materials used. For example, a silicon-based semiconductor material having P-type conductivity can be doped with a P-type dopant (e.g., a Group III dopant, such as boron (B) or indium (In)), whereas a silicon-based semiconductor material having N-type conductivity is can be doped with a N-type dopant (e.g., a Group V dopant, such as arsenic (As), phosphorous (P) or antimony (Sb)). Alternatively, a gallium nitride (GaN) or gallium arsenide (GaAs)-based semiconductor material having P-type conductivity can be doped with beryllium (Be) or magnesium (Mg), whereas a gallium nitride (GaN) or gallium arsenide (GaAs)-based semiconductor material having N-type conductivity can be doped with silicon (Si).

In any case, these multiple semiconductor layers can further be formed such that the first semiconductor layers 711*a*-*d* are different from the second semiconductor layers 712*a*-*d* in composition or crystalline structure so that the second semiconductor layers 712a-d can be selectively etched over the first semiconductor layers 711a-d during subsequent processing, as discussed in greater detail below, at process step 514. For example, the first semiconductor layers 711a-d can comprise a semiconductor material (e.g., silicon) and can be doped (e.g., in situ doped during an epitaxial deposition process or subsequently implanted) with a first dopant (e.g., a P-type dopant, such as boron) so as to have the first type conductivity (e.g., P-type conductivity). The second semiconductor layers 712a-d can comprise, for example, the same semiconductor material (e.g., silicon). However, the second semiconductor layers 712a-d can be left undoped (i.e., intrinsic) or, alternatively, can be doped (e.g., in situ doped during an epitaxial deposition process or subsequently implanted) with a second dopant (e.g., an N-type dopant, see dopant discussion above), which is different than the first dopant, so as to have a second type conductivity that different from the first type conductivity (e.g., N-type conductivity). As a result, the second semiconductor layers 712a-d can be selectively etched over the first semiconductor layers 711a-d at process 514. In another example, the first semiconductor layers 711a-d and the second semiconductor layers 712a-d can comprise, for example, the same type conductivity (e.g., the first type conductivity, such as P-type conductivity). However, the first semiconductor layers 711a-d can comprise a first semiconductor material (e.g., silicon germanium) and the second semiconductor layers 712a-d can comprise a second semiconductor material (e.g., silicon) that is different from the first semiconductor material. As a result, the second semiconductor layers 712a-d can be selectively etched over the first semiconductor layers 711a-d at process 514.

In any case, the thickness of each of these multiple semiconductor layers can, for example, range between 10 nm and 200 nm. Additionally, it should be noted that, for purposes of illustration, four first semiconductor layers 711a-d and four second semiconductor layers 712a-d are shown in FIG. 7. However, it should be understood that the multiple semiconductor layers can comprise any number of two or more first semiconductor layers and any number of two or more second semiconductor layers. It should also be noted that, when an SOI wafer is used, the lowest first semiconductor layer in the stack (i.e., see first semiconductor layer 711a) can correspond to the semiconductor layer 103, shown in FIG. 6A. This semiconductor layer 103 can be implanted with the first dopant so as to have the first type conductivity and then each subsequent layer in the stack 710 can be deposited, as described above.

After the multiple semiconductor layers are formed at process 511, one or more dielectric layers 191-192 can be formed on the top surface 713 of the stack 710 of semiconductor layers (see FIG. 7). For example, a first dielectric layer 191, such a silicon dioxide layer, can be formed (e.g., deposited) on the last semiconductor layer in the stack 710 (e.g., see the uppermost second semiconductor layer 712d). Then, a second dielectric layer 192 (e.g., a silicon nitride layer) can be formed (e.g., deposited) on the first dielectric layer 191.

Figure 8:
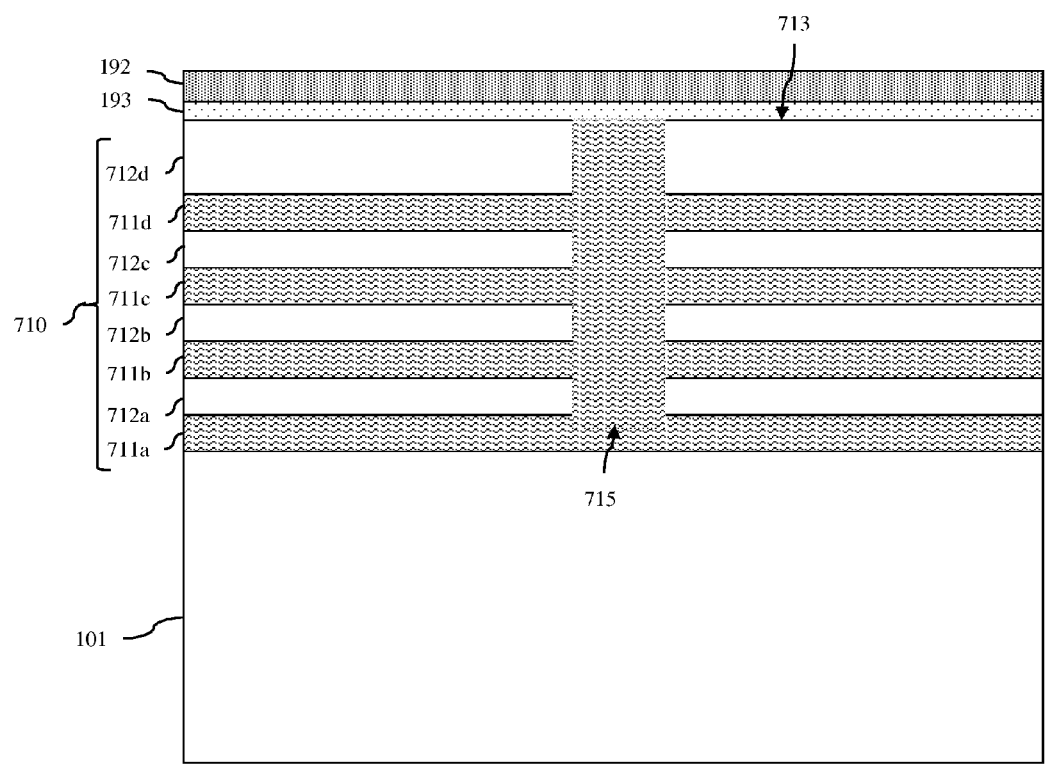
FIG. 8 is a partially completed semiconductor device formed according to the method of FIG. 5.

A dopant implant region 715 can then be formed by implanting a specific dopant into a desired location in the stack 710 such that it extends vertically from the top surface 713 of the stack 710 to at least a lowest first semiconductor layer (e.g., see first semiconductor layer 711a) in the stack 710 (512, see FIG. 8). The specific dopant used to form the dopant implant region 715 can be preselected so that the portions of the second semiconductor layers 712a-d contained within the dopant implant region 715 will etch, during the subsequent etch process 514 discussed in detail below, at approximately the same rate as the first semiconductor layers 711a-d and at a significantly slower rate than other portions of the second semiconductor layers 712a-d outside the dopant implant region 715. For example, if the first semiconductor layers 711a-d are doped with a first dopant (e.g., a P-type dopant, such as boron) so as to have the first type conductivity (e.g., P-type conductivity) and the second semiconductor layers 712a-d are undoped or doped so as to have the second type conductivity, the specific dopant used to dope the dopant implant region 715 can be the same first dopant (e.g., boron) used to achieve the first type conductivity (e.g., the P-type conductivity) in the first semiconductor layers 711a-d. As a result, the entire dopant implant region 715, including the portions of the second semiconductor layers 712a-d contained therein, will be doped with the first dopant (e.g. will be boron-doped) and, during the subsequent etch process 514, can be etched at a significantly slower etch rate than the portions of the second semiconductor layers 712a-d outside the dopant implant region 715. In another example, if the first semiconductor layers 711a-d comprise a first semiconductor material and, particularly, silicon germanium, and if the second semiconductor layers 712a-d comprise a second semiconductor material that is different from the first semiconductor material and, particularly, silicon, the specific dopant used to dope the dopant implant region 715 can comprise germanium. As a result, the entire dopant implant region 715, including the portions of the second semiconductor layers 712a-d contained therein, will comprise silicon germanium and, during the subsequent etch process 514, can be etched at a significantly slower etch rate than the portions of the second semiconductor layers 712a-d outside the dopant implant region 715.

Conventional processing techniques can be used to form such a dopant implant region 715. For example, a mask layer can be formed on the second dielectric layer 192 and lithographically patterned with an opening corresponding to the desired location in the stack 710 for the dopant implant region 715. Then, a dopant implantation process can be performed in order to implant the specific dopant, which is preselected as discussed above, into the desired location in the stack 710, thereby forming the dopant implant region 715.

Figure 9A:
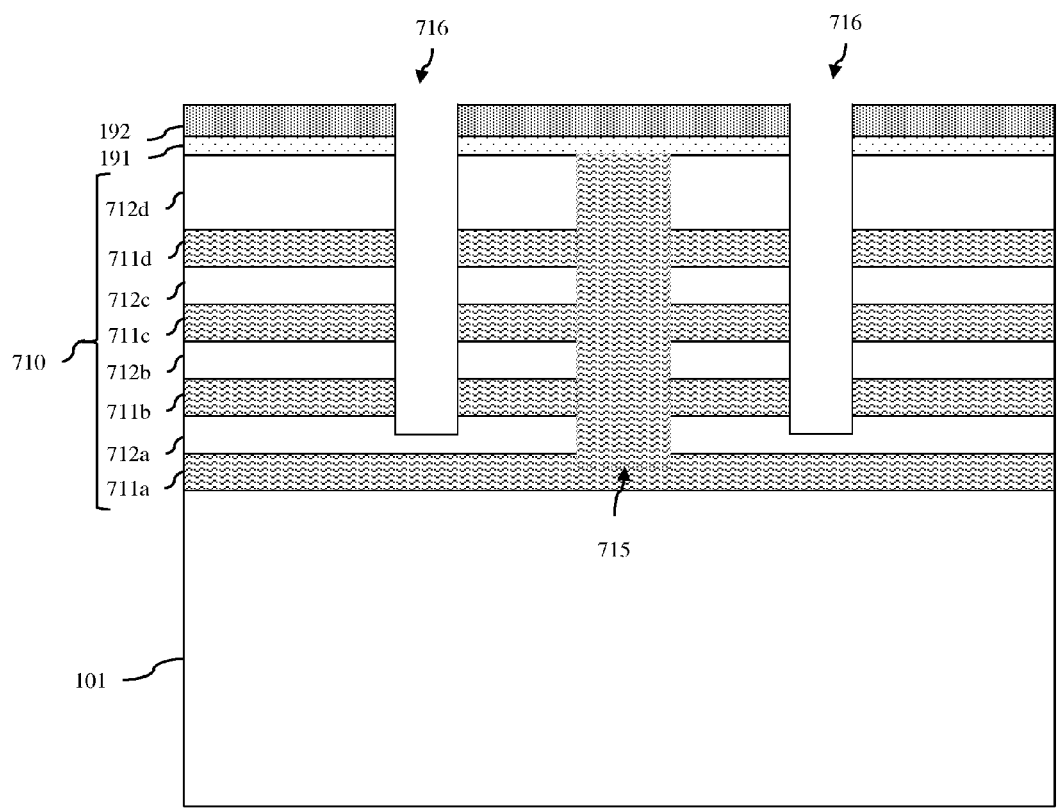
FIG. 9A is a partially completed semiconductor device formed according to the method of FIG. 5.
Figure 9B:
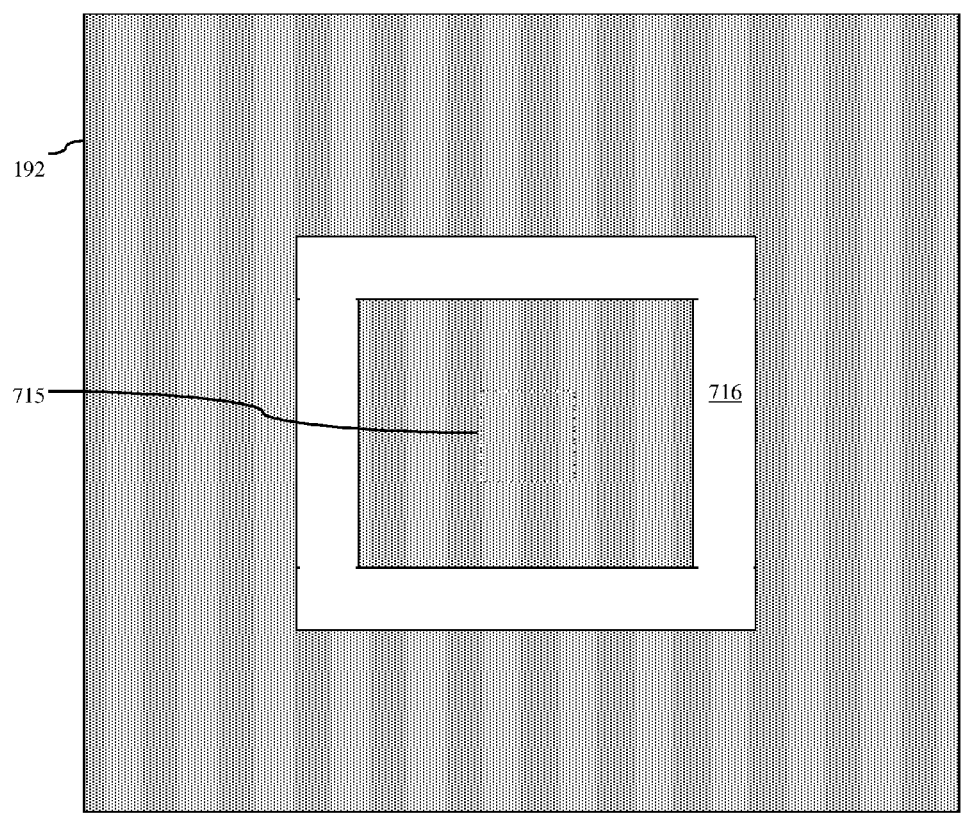
FIG. 9B is a top view diagram illustrating the partially completed semiconductor device of FIG. 9A.

Additionally, a trench 716 can be formed that wraps around and is physically separated from the dopant implant region 715 (513, see FIGS. 9A and 9B). This trench 716 can be formed (e.g., using conventional lithographically patterning and etch techniques) such that it extends vertically from the top surface 713 of the stack 710 to at least a lowest second semiconductor layer in the stack 710 (e.g., see second semiconductor layer 712a). As illustrated in FIG. 9B, the trench 716 can, for example, be formed such that the dopant implant region 715 is essentially centered within the portion of the stack 710 defined by the trench 716.

Figure 10:
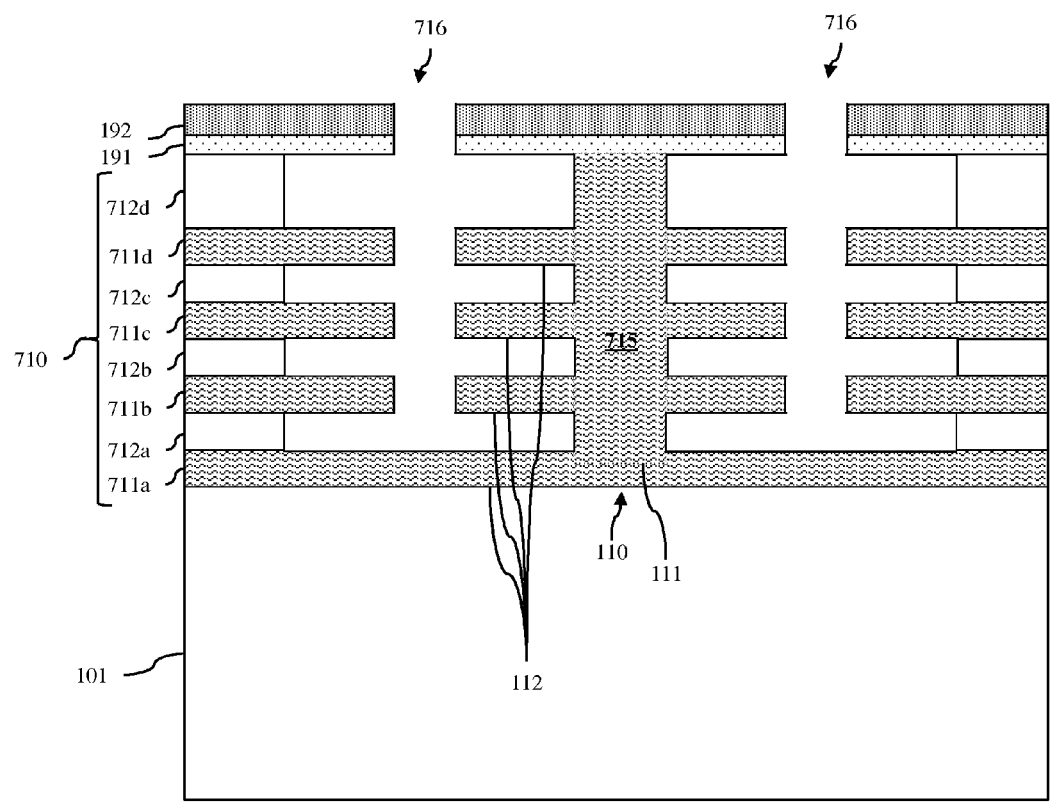
FIG. 10 is a partially completed semiconductor device formed according to the method of FIG. 5.

Next, exposed surfaces of the second semiconductor layers 712a-b within the trench 716 can be selectively etched over the first semiconductor layers 711a-d and the dopant implant region 715 (514, see FIG. 10). For example, at process 514, if the multiple semiconductor layers all comprise silicon, if the first dopant used to dope the first semiconductor layers 711a-d is boron, if the specific dopant used to form the dopant implant region 715 is also boron, and if the second semiconductor layers 712a-d comprise undoped silicon, etchants such as potassium hydroxide (KOH) or ethylene dibromide (EDB), could be used to selectively etch the exposed surfaces of the second semiconductor layers 712a-d within the trench 716 over the first semiconductor layers 711a-d because such etchants exhibit a significantly slower etch rate for boron-doped silicon as compared to undoped silicon. In another example, at process 514, if the first semiconductor layers 711a-d comprise silicon germanium, if the second semiconductor layers 712a-d comprise silicon, if the first semiconductor layers and second semiconductor layers have the same type conductivity (e.g., a first type conductivity), and if the specific dopant used to dope the dopant implant region 715 comprises germanium, then etchants such as tetramethylammonium hydroxide (TMAH), ammonium hydroxide (NH$_4$OH), ethylenediamine pyrocatechol (EDP), or potassium hydroxide (KOH), could be used to selectively etch the exposed surfaces of the second semiconductor layers 712a-d within the trench 716 over the first semiconductor layers 711a-d because such etchants exhibit a significantly slower etch rate for silicon germanium as compared to silicon. By selectively etching the exposed surfaces of the second semiconductor layers 712a-d over the first semiconductor layers 711a-d and dopant implant region 715, this process 514 results in the formation of a first semiconductor body 110 having the first type conductivity (e.g., P-type conductivity) and comprising a first vertical portion 111, which corresponds to the dopant implant region 715, and multiple first horizontal portions 112 in contact with and extending laterally from the first vertical portion 111.

Figure 11:
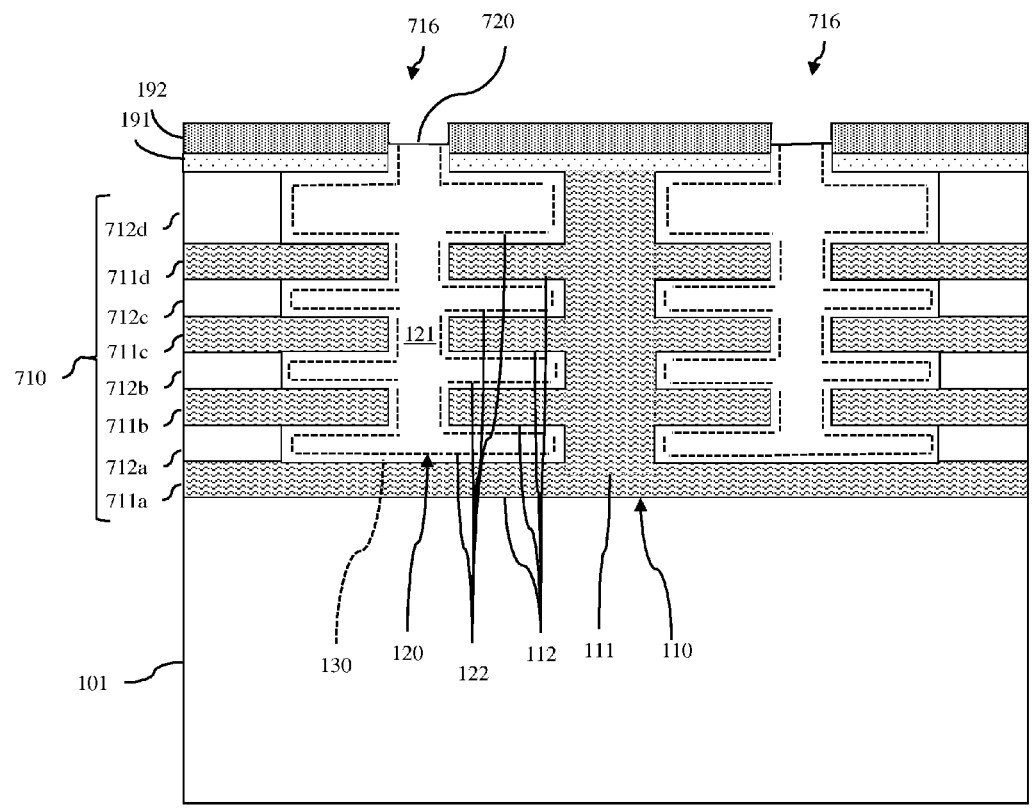
FIG. 11 is a partially completed semiconductor device formed according to the method of FIG. 5.

After the first semiconductor body 110 is formed, the method can comprise forming a second semiconductor body 120 positioned laterally adjacent to the first semiconductor body 110 (530, see FIG. 11). This second semiconductor body 120 can specifically be formed at process 530 so as to have a second vertical portion 121 and multiple second horizontal portions 122 in contact with and extending laterally from the second vertical portion 121 such that they are interleaved with the multiple first horizontal portions 112. For example, the second semiconductor body 120 can be formed by epitaxially depositing an additional semiconductor layer 720 (e.g., a silicon-based semiconductor layer or other suitable semiconductor layer) into the trench 716. The additional semiconductor layer 720 used to form the second semiconductor body 120 can comprise the same semiconductor material as that used to form the first semiconductor body 110. Alternatively, this additional semiconductor layer 720 can comprise a different semiconductor material. In any case, as a result of the shape of the trench 716 following the selective etch process, the resulting second semiconductor body 120 will comprise a second vertical portion 121, which corresponds to the original dimensions of the trench 716, and multiple second horizontal portions, which are in contact with and extend laterally from the second vertical portion 121 and which fill the spaces created when exposed surfaces of the second semiconductor layers 712a-d were etched back so that they are interleaved (i.e., interdigitated, interlocked, etc. as in a box joint or finger joint) with the multiple first horizontal portions 112. Thus, each pair of adjacent first horizontal portions of the first semiconductor body 110 is separated by a second horizontal portion of the second semiconductor body 120 and vice versa. It should be noted that the sizes of the spaces between adjacent first horizontal portions 112 and between adjacent second horizontal portions 122 is a function of the thicknesses of the first semiconductor layers 711a-d and second semiconductor layers 712a-b and can be essentially uniform, as illustrated, if those layers 711a-d and 712a-d all have the same thicknesses. Alternatively, the sizes of such spaces can be varied if the thicknesses of the layers 711a-d and 712a-d are varied.

As mentioned above, the first semiconductor body 110 can be formed at process 510 so as to have a first type conductivity (e.g., P-type conductivity).

When the semiconductor device 100A, 100B being formed according to the disclosed methods is a diode (e.g., a PN junction diode or a PIN junction diode), the second semiconductor body 120 can be formed at process 530 so as to have a second type conductivity different from the first type conductivity (e.g., N-type conductivity). For example, the additional semiconductor layer 720 can be in situ doped during the epitaxial deposition with a second type dopant (e.g., an N-type dopant) so that the second semiconductor body 120 has the second type conductivity (e.g., N-type conductivity) (531). However, when the semiconductor device 100A, 100B being formed according to the disclosed methods is a capacitor, the second semiconductor body 120 can be formed at process 530 so as to have the same first type conductivity as the first semiconductor body 110 (e.g., P-type conductivity) or, alternatively, a different type conductivity than the first semiconductor body 110 (e.g., N-type conductivity). That is, the additional semiconductor layer 720 can be in situ doped during the epitaxial deposition process with either the same first type dopant (e.g., a P-type dopant) used for the first semiconductor body 110 or a second type dopant (e.g., an N-type dopant) (532).

When the semiconductor device 100A or 100B being formed according to the disclosed method is a PN junction diode, the second semiconductor body 120 can be formed so as to abut (i.e., so as to be immediately adjacent to) the first semiconductor body 110. That is, the additional semiconductor layer 720 that forms the second semiconductor body 120 can be epitaxially deposited into the trench 716 immediately following the selective etch process 514 such that it is positioned immediately adjacent to exposed surfaces of the first semiconductor body 110. Thus, the horizontal surfaces and end surface of the first horizontal portions 112 of the first semiconductor body 110 will abut adjacent surfaces of the second semiconductor body 120 and the horizontal surfaces and end surface of the second horizontal portions 122 of the second semiconductor body 120 will abut adjacent surfaces of the first semiconductor body 110, thereby creating the P-type semiconductor material-N-type semiconductor material (PN) junction. It should be noted that, if the multiple semiconductor layers in the stack 710 comprise a monocrystalline semiconductor material (e.g., monocrystalline silicon), epitaxial deposition of the additional semiconductor layer within the trench 716 will result in a second semiconductor body 120 that is essentially monocrystalline in structure. However, any portion of the additional semiconductor layer that is epitaxially deposited adjacent to dielectric material (e.g., at the opening within the dielectric layers 191-192 and on the top surface of the second dielectric layer 192) will be polycrystalline in structure.

When the semiconductor device 100A or 100B being formed according to the disclosed methods is either a PIN junction diode or a capacitor, the methods can further comprise forming an optional conformal layer 130 on the first semiconductor body 110 prior to formation of the second semiconductor body 120 so as to physically separate the first semiconductor body 110 from the second semiconductor body 120 (520). This optional conformal layer 130 is shown in FIG. 11 and it will vary depending upon whether the semiconductor device 100A, 100B being formed is a PIN junction diode or a capacitor.

For a PIN junction diode, this conformal layer 130 can comprise an intrinsic semiconductor layer (e.g., a conformal intrinsic silicon layer or any other suitable conformal intrinsic semiconductor layer) that is deposited (e.g., epitaxially) so as to line the trench 716 (521). That is, the conformal intrinsic semiconductor layer can be deposited so as to line the horizontal and end surfaces of the first horizontal portions 112 of the first semiconductor body 110 as well as the vertical surfaces of the first vertical portion 111 adjacent to and between the first horizontal portions 112 within the trench 716. Thus, it will physically separate the first semiconductor body 110 from the second semiconductor body 120 that is subsequently formed within the trench 716, thereby creating the P-type semiconductor material-Intrinsic semiconductor material-N-type semiconductor material (PIN) junction. For purposes of this disclosure, "an intrinsic semiconductor layer" refers to a semiconductor layer that is not doped with a dopant that alters conductivity (i.e., not doped with a P-type dopant or an N-type dopant). Thus, an intrinsic semiconductor layer is neither a P-type semiconductor layer, nor an N-type semiconductor layer. It should be noted that, if the multiple semiconductor layers in the stack 710 comprise a monocrystalline semiconductor material (e.g., monocrystalline silicon), epitaxial deposition of the intrinsic semiconductor layer and additional semiconductor layer within the trench 716 will result in a second semiconductor body that is essentially monocrystalline in structure. However, any portion of the intrinsic semiconductor layer and additional semiconductor layer that is epitaxially deposited adjacent to dielectric material (e.g., at the opening within the dielectric layers 191-192 and on the top surface of the second dielectric layer 192) will be polycrystalline in structure.

For a capacitor, this conformal layer 130 can comprise a conformal dielectric layer (e.g., an oxide layer, a nitride layer, an oxynitride layer, or any other suitable dielectric layer) that is deposited, for example, by low-pressure chemical vapor deposition (LPCVD) or any other suitable deposition technique, so as to line the trench 716 (522). That is, the conformal dielectric layer can be deposited so as to line the horizontal and end surfaces of the first horizontal portions 112 of the first semiconductor body 110 as well as the vertical surfaces of the first vertical portion 111 adjacent to and between the first horizontal portions 112 within the trench 716. Thus, it will physically separate the first semiconductor body 110 from the second semiconductor body 120 that is subsequently formed within the trench 716, thereby creating the conductor-dielectric-conductor junction. It should be noted that epitaxial deposition of an additional semiconductor layer on such a conformal dielectric layer within the trench 716 will result in a second semiconductor body 120 that is essentially polycrystalline in structure.

After an optional conformal layer 130 is deposited at process 520 (if applicable) and after the additional semiconductor layer 720 is deposited at process 530 to form the second semiconductor body 120, the conformal layer 130 (if applicable) and the additional semiconductor layer 720 can be etched back in order to expose the top surface of the second dielectric layer 192 (see FIG. 11). Then, isolation region(s) can be performed in order to ensure that the resulting semiconductor device 100A or 100B is electrically isolated from the semiconductor substrate 101 below and from other devices on that semiconductor substrate 101 (540).

Figure 12A:
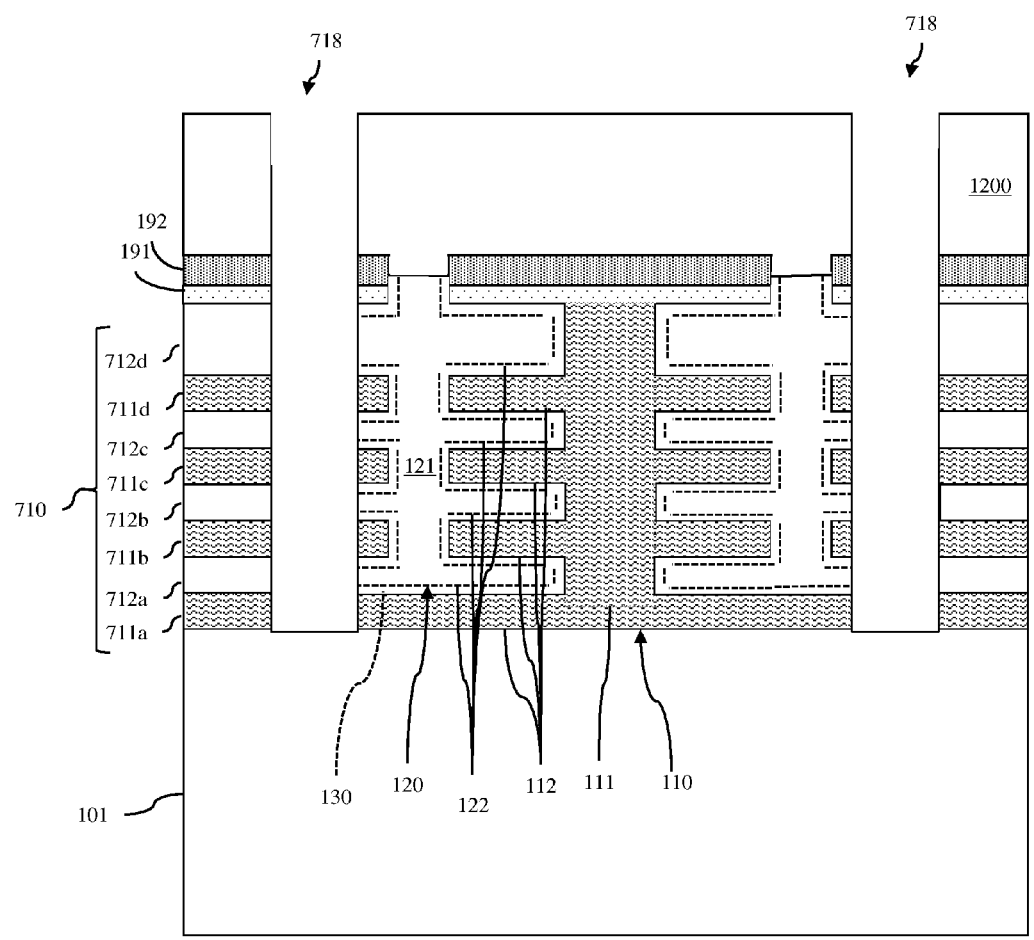
FIG. 12A is a partially completed semiconductor device formed according to the method of FIG. 5.
Figure 12B:
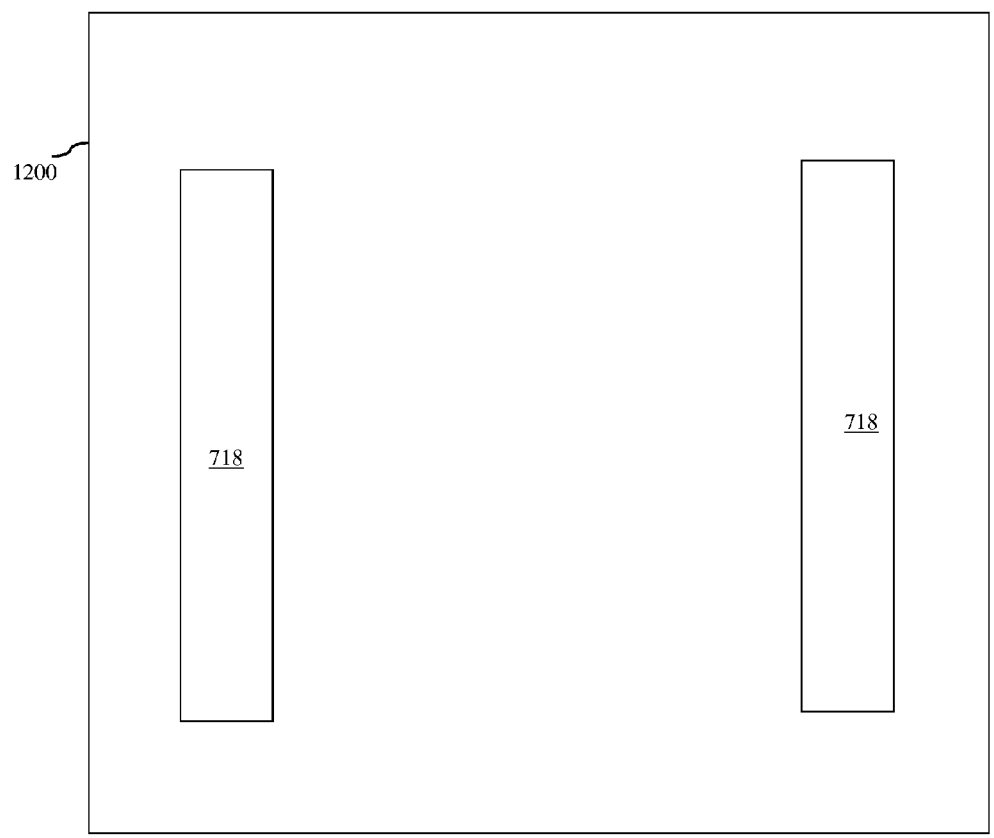
FIG. 12B is a top view diagram illustrating the partially completed semiconductor device of FIG. 12A.

For example, in the case of semiconductor device 100A formed on an SOI wafer, an additional trench can be lithographically patterned and etched so that it is positioned laterally adjacent to and wraps around the outer sidewall of the second vertical portion 121 of the second semiconductor body 120 (i.e., laterally surrounding the first semiconductor body 110 and the second semiconductor body 120) and so that it extends vertically to the insulator layer 102. This additional trench can subsequently be filled one or more isolation materials 106 (e.g., silicon dioxide, a silicon nitride, a silicon oxynitride, or any other suitable isolation material(s)), thereby creating a continuous trench isolation region 105 that defines the outer boundaries of the semiconductor device 100A (see FIGS. 1, 3 and 4). The insulator layer 102 and the trench isolation region 105 in combination will electrically isolate the semiconductor device 100A from the semiconductor substrate below 101 as well as from other devices on the semiconductor substrate 101. However, in the case of the semiconductor device 100B formed on a bulk semiconductor wafer without the insulator layer 102, additional processes must be performed in order to ensure that the semiconductor device 100B is electrically isolated from both the semiconductor substrate 101 below and form other devices on that semiconductor substrate 101. Specifically, the method can comprise forming a mask 1200 above the second dielectric layer 192 and lithographically patterning the mask 1200 with openings for first opposing trenches 718 adjacent to the outer sidewall of the second vertical portion 121 of the second semiconductor body 120. An etch process and, particularly, an anisotropic etch process can then be performed to form first opposing trenches 718 that extend vertically to the semiconductor substrate 101. As illustrated in FIGS. 12A and 12B, the first opposing trenches 718 can specifically be patterned so the first semiconductor body 110 and second semiconductor body 120 will be positioned laterally between them following this etch process (see FIGS. 12A and 12B).

Figure 13:
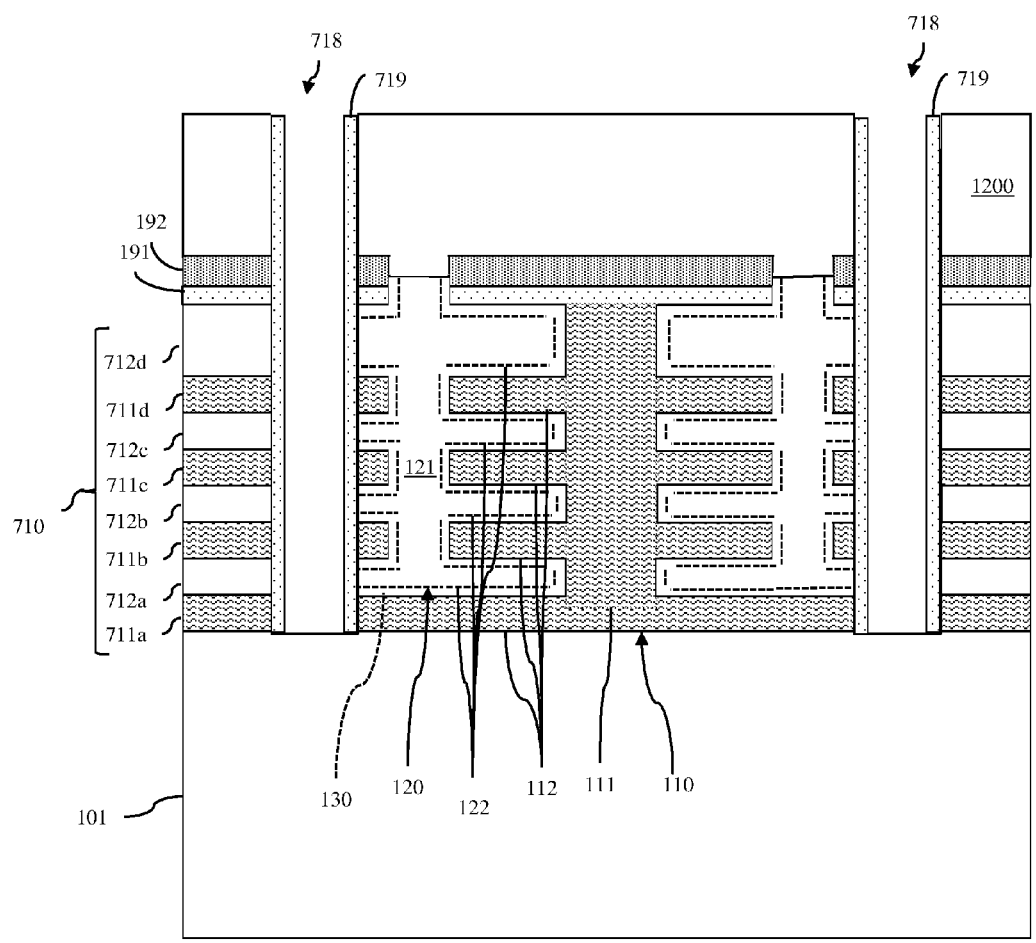
FIG. 13 is a partially completed semiconductor device formed according to the method of FIG. 5.
Figure 14:
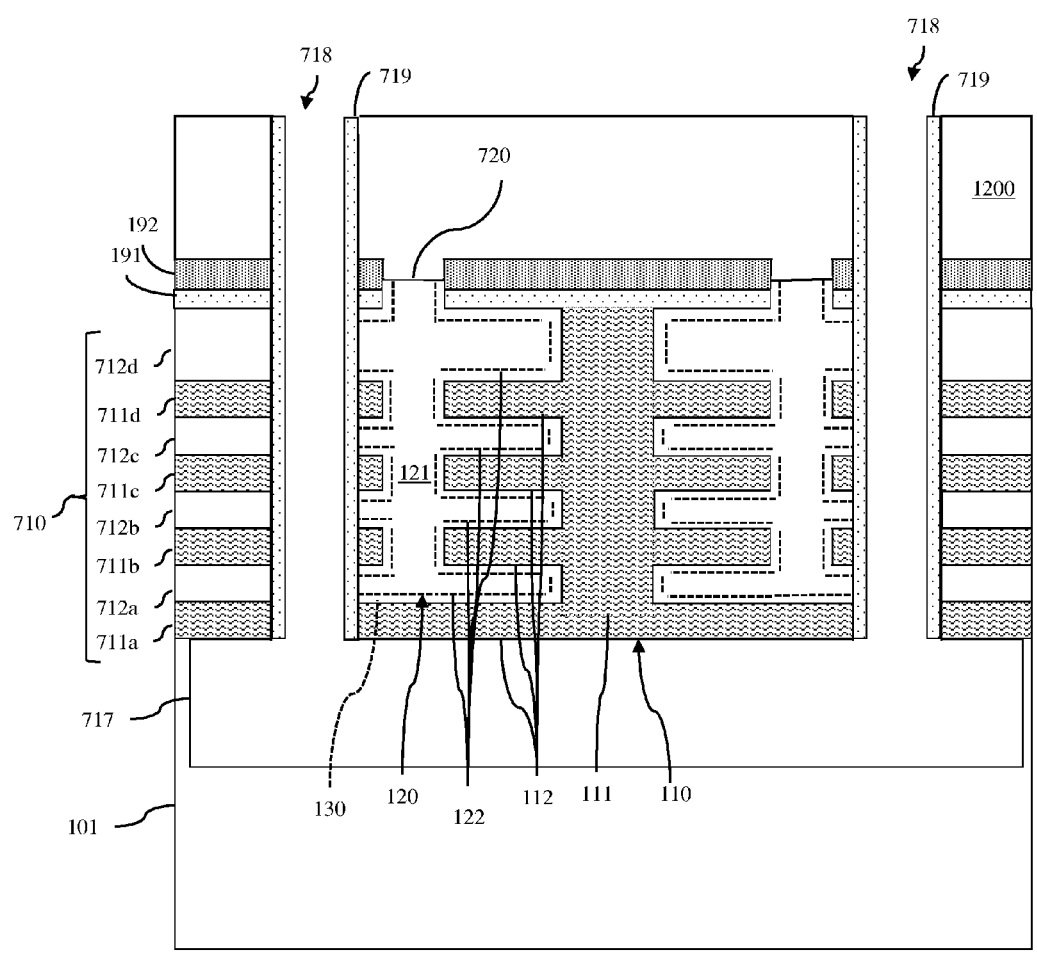
FIG. 14 is a partially completed semiconductor device formed according to the method of FIG. 5; and, FIG. 15 is a partially completed semiconductor device formed according to the method of FIG. 5.

Dielectric sidewall spacers 719 (e.g., oxide sidewall spacers, nitride sidewall spacers, etc.) can be formed (e.g., using conventional sidewall spacer formation techniques) on the exposed vertical sidewalls within the first opposing trenches 718 (see FIG. 13). Then, another etch process and, particularly, an isotropic etch process can then be performed so as to laterally expand lower portions of the first opposing trenches within the semiconductor substrate 101 so that those lower portions are merged, thereby forming a cavity 717 that extends below the first semiconductor body 110 and the second semiconductor body 120 (see FIG. 14). The dielectric sidewall spacers 719 protect the semiconductor materials above the semiconductor substrate 101 from being simultaneously etched.

Figure 15:
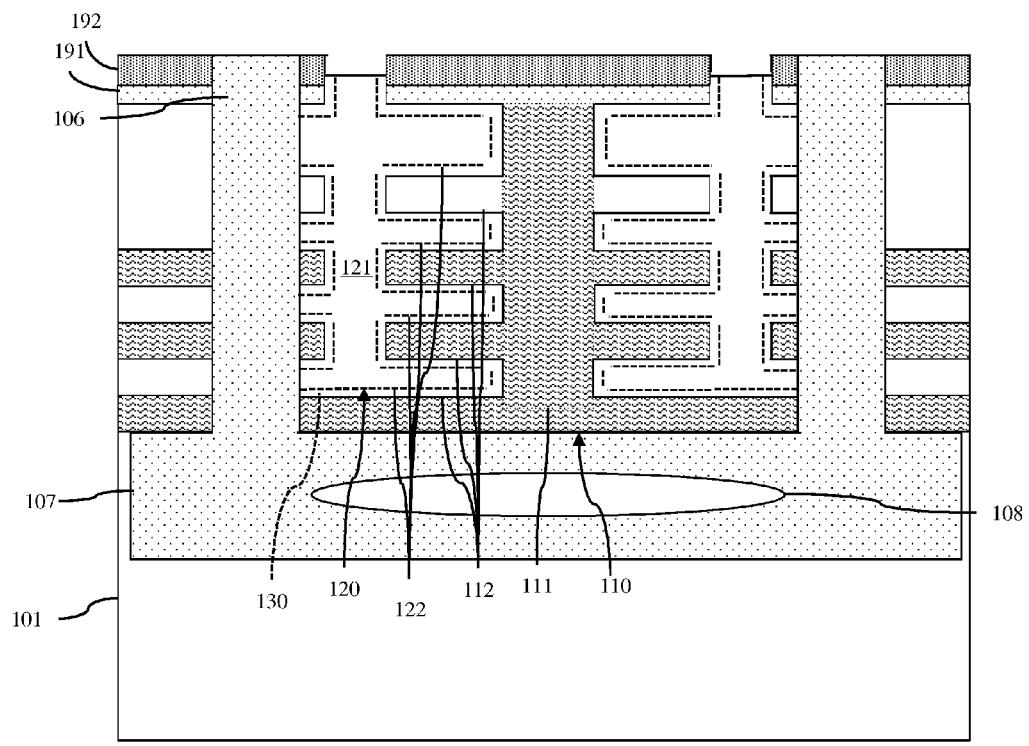

One or more isolation materials 106 (e.g., silicon dioxide, a silicon nitride, a silicon oxynitride, or any other suitable isolation material(s)) can then be deposited so as to fill the cavity 717, thereby forming a buried isolation region 107, and so as to fill the first opposing trenches 718, thereby forming first trench isolation regions (see FIG. 15). As a result of this deposition process, one or more airgaps 108 (i.e., voids) may be created within the isolation material(s) 106 that fill the cavity of the buried isolation region 107.

Second opposing trenches can then be formed (e.g., lithographically patterned and etched) so that they are adjacent to the outer sidewall of the second vertical portion 121 of the second semiconductor body, so that they are perpendicular to and contact with the first trench isolation regions, so that the first semiconductor body 110 and second semiconductor body 120 are positioned laterally between the second opposing trenches, and so that the extend vertically to the buried isolation region 107. One or more isolation materials 106 (e.g., silicon dioxide, a silicon nitride, a silicon oxynitride, or any other suitable isolation material(s)) can again be deposited so as to fill the second opposing trenches, thereby forming second trench isolation regions that are merged with the first trench isolation regions to create a continuous trench isolation region 105 that defines the boundaries of the semiconductor device 100B (see FIGS. 2, 3 and 4). The buried isolation region 107 and the trench isolation region 105 in combination will electrically isolate the semiconductor device 100B from the semiconductor substrate below 101 as well as from other devices on the semiconductor substrate 101.

Additional processing can subsequently be performed in order to complete the semiconductor device 100A, 100B (550). For example, one or more additional dielectric layers 193 (e.g., interlayer dielectrics) can be formed (e.g., deposited) on the silicon nitride layer 192. The additional dielectric layer(s) can comprise, for example, one or more layers of any of the following dielectric materials: silicon dioxide, silicon nitride, silicon oxynitride, borophosphosilicate glass (BPSG), etc. Then contacts 195 can be formed that extending vertically through the dielectric layers 191-193 to the first semiconductor body 110 and to the second semiconductor body 120.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed devices and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are semiconductor devices (e.g., diodes, such as PN junction diodes and PIN junction diodes, and capacitors) that have semiconductor bodies with interleaved horizontal portions. In the case of a diode, the semiconductor bodies can have different type conductivities and, optionally, can be separated by an intrinsic semiconductor layer. In the case of a capacitor, the semiconductor bodies can have the same or different type conductivities and can be separated by a dielectric layer. In any case, due to the interleaved horizontal portions, the semiconductor devices each have a relatively large active device region within a relatively small area on an integrated circuit chip. Also disclosed herein are methods of forming such semiconductor devices.

What is claimed is:

1. A semiconductor device comprising:
   a first semiconductor body comprising:
      a first vertical portion comprising a dopant implant region extending vertically through a stack of alternating first semiconductor layers and second semiconductor layers; and,
      multiple first horizontal portions comprising sections of said first semiconductor layers extending laterally from said first vertical portion and beyond said second semiconductor layers;
   a second semiconductor body adjacent to said first semiconductor body,
      said first semiconductor body having a first type conductivity and said second semiconductor body having a second type conductivity different from said first type conductivity, and
      said second semiconductor body comprising an additional semiconductor layer comprising:
         a second vertical portion; and,
         multiple second horizontal portions continuous with and extending laterally from said second vertical portion, said second horizontal portions being interleaved with said first horizontal portion; and,
   a conformal intrinsic semiconductor layer on said first semiconductor body and physically separating said first semiconductor body from said second semiconductor body.

2. The semiconductor device of claim 1, further comprising:
   a semiconductor substrate;
   a buried isolation region in said semiconductor substrate, said first semiconductor body and said second semiconductor body being above said buried isolation region; and,
   a trench isolation region positioned laterally around said first semiconductor body and said second semiconductor body and extending vertically to said buried isolation region.

3. The semiconductor device of claim 1, further comprising:
   a semiconductor substrate;
   an insulator layer on said semiconductor substrate, said first semiconductor body and said second semiconductor body being above said insulator layer; and,
   a trench isolation region positioned laterally around said first semiconductor body and said second semiconductor body and extending vertically to said insulator layer.

4. The semiconductor device of claim 1, further comprising contacts to said first semiconductor body and said second semiconductor body.

5. The semiconductor device of claim 1, said first semiconductor body comprising any one of boron-doped silicon and silicon germanium.

6. A method comprising:
forming a first semiconductor body comprising: a first vertical portion; and, multiple first horizontal portions in contact with and extending laterally from said first vertical portion;
forming a second semiconductor body adjacent to said first semiconductor body, said second semiconductor body comprising: a second vertical portion; and, multiple second horizontal portions in contact with and extending laterally from said second vertical portion, said second horizontal portions being interleaved with said first horizontal portions, said first semiconductor body being formed so as to have a first type conductivity and said second semiconductor body being formed so as to have a second type conductivity different from said first type conductivity; and,
before said forming of said second semiconductor body, forming a conformal intrinsic semiconductor layer on said first semiconductor body.

7. The method of claim 6, said forming of said conformal intrinsic semiconductor layer comprising epitaxially depositing said conformal intrinsic semiconductor layer and said forming of said second semiconductor body comprising epitaxially depositing an additional semiconductor layer on said conformal intrinsic semiconductor layer.

8. The method of claim 7, said additional semiconductor layer being in situ doped so as to have said second type conductivity.

9. The method of claim 7, said first semiconductor body and said second semiconductor body comprising different semiconductor materials.

10. A method of forming a semiconductor device, said method comprising:
forming a first semiconductor body comprising a first vertical portion and multiple first horizontal portions in contact with and extending laterally from said first vertical portion, said forming of said first semiconductor body comprising:
forming multiple semiconductor layers in a stack, said multiple semiconductor layers comprising alternating first semiconductor layers and second semiconductor layers that are different from said first semiconductor layers;
forming a dopant implant region extending vertically from a top surface of said stack to at least a lowest first semiconductor layer in said stack;
forming a trench around and physically separated from said dopant implant region, said trench extending vertically from said top surface of said stack to at least a lowest second semiconductor layer in said stack; and,
after said forming of said trench, selectively etching exposed surfaces of said second semiconductor layers over said first semiconductor layers and said dopant implant region so as to form said first semiconductor body; and
forming a second semiconductor body adjacent to said first semiconductor body, said forming of said second semiconductor body comprising epitaxially depositing an additional semiconductor layer in said trench such that said second semiconductor body comprises a second vertical portion and multiple second horizontal portions in contact with and extending laterally from said second vertical portion, said second horizontal portions being interleaved with said first horizontal portions.

11. The method of claim 10, said first semiconductor body being formed so as to have a first type conductivity and said method further comprising, during said epitaxially depositing of said additional semiconductor layer, in situ doping said additional semiconductor layer so that said second semiconductor body has a second type conductivity different from said first type conductivity.

12. The method of claim 10, further comprising, after said selectively etching and before said forming of said second semiconductor body, epitaxially depositing a conformal intrinsic semiconductor layer in said trench.

13. The method of claim 10, further comprising, after said selectively etching and before said forming of said second semiconductor body, forming a conformal dielectric layer in said trench.

14. The method of claim 10, said multiple semiconductor layers being formed on a bulk semiconductor substrate and said method further comprising, after said forming of said second semiconductor body, forming a buried isolation region below said first semiconductor body and said second semiconductor body and a trench isolation region positioned laterally around said first semiconductor body and said second semiconductor body and extending vertically to said buried isolation region.

15. The method of claim 10, said multiple semiconductor layers being formed above an insulator layer on a semiconductor substrate and said method further comprising, after said forming of said second semiconductor body, forming a trench isolation region positioned laterally around said first semiconductor body and said second semiconductor body and extending vertically to said insulator layer.

16. The method of claim 10, further comprising forming contacts to said first semiconductor body and said second semiconductor body.

17. The method of claim 10, said first semiconductor layers and said dopant implant region comprising any one of boron-doped silicon and silicon germanium.

* * * * *